(12) United States Patent
Lee et al.

(10) Patent No.: US 7,629,274 B2
(45) Date of Patent: Dec. 8, 2009

(54) METHOD OF FABRICATING A STORAGE NODE

(75) Inventors: Jung-Hyun Lee, Yongin-si (KR);
Sang-Bong Bang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 250 days.

(21) Appl. No.: 11/508,931

(22) Filed: Aug. 24, 2006

(65) Prior Publication Data

US 2007/0045701 A1  Mar. 1, 2007

(30) Foreign Application Priority Data

Aug. 24, 2005 (KR) .................... 10-2005-0078040

(51) Int. Cl.
*H01L 21/26* (2006.01)

(52) U.S. Cl. ............................ 438/798; 257/E21.328

(58) Field of Classification Search ............ 257/E21.01, 257/E29.343, E21.328; 438/466, 798
See application file for complete search history.

(56) References Cited

U.S. PATENT DOCUMENTS

| | | | |
|---|---|---|---|
| 5,837,593 A * | 11/1998 | Park et al. ................... 438/396 |
| 6,511,856 B2 * | 1/2003 | Van Buskirk et al. .......... 438/3 |
| 2003/0219941 A1 * | 11/2003 | Basceri et al. ............. 438/240 |
| 2004/0048452 A1 * | 3/2004 | Sugawara et al. ........... 438/484 |
| 2005/0079640 A1 * | 4/2005 | Potter .......................... 438/19 |

* cited by examiner

*Primary Examiner*—Jerome Jackson, Jr.
*Assistant Examiner*—Paul A Budd
(74) *Attorney, Agent, or Firm*—Harness, Dickey & Pierce, P.L.C.

(57) ABSTRACT

A storage node, a method of fabricating the same, a semiconductor memory device and a method of fabricating the same is provided. The method of fabricating a storage node may include forming a lower electrode, forming an irradiated data storage layer and forming an upper electrode.

5 Claims, 9 Drawing Sheets

METHOD OF FABRICATING A STORAGE NODE

PRIORITY STATEMENT

This application claims priority under 35 U.S.C. §119 to Korean Patent Application No. 10-2005-0078040, filed on Aug. 24, 2005, in the Korean Intellectual Property Office (KIPO), the entire contents of which are incorporated herein by reference.

BACKGROUND

1. Field

Example embodiments relate to a storage node, method of fabricating the same, semiconductor device and method of fabricating the same.

2. Description of the Related Art

Semiconductor memory devices may be fabricated in various shapes in order to obtain improved characteristics (e.g., lower price, lower power consumption, higher speed capability and/or non-volatility). For example, DRAM (dynamic random access memory) may be volatile and relatively difficult to mix with logic LSI (large-scale integration) devices. SRAM (static random access memory) may be relatively easy to mix with LSI devices. Because cells are formed of six transistors in SRAMs, a unit cell area may be relatively large. Also, SRAM may be costly. Flash memory for improving defects in a ROM (read-only memory) may be comparatively easy to mix with logic LSI devices, may be cheaper and may consume less power. However, in flash memory, writing may be slow and the number of times recording may be repeated is limited to one million times or less.

To improve semiconductor memory devices, research is being conducted into a non-volatile memory device that combines the characteristics of a volatile memory device and those of a non-volatile memory device (e.g., a FRAM, a PRAM, a MRAM and/or a RRAM).

FRAM, PRAM, MRAM and RRAM have a relatively fast writing speed. High capacity FRAM may be difficult to develop because it may be relatively difficult to reduce the cell area of FRAM. It may be relatively easy to miniaturize PRAM but the reset current for PRAM may need to be reduced in order to obtain lower power consumption. High capacity MRAM may be difficult to develop because a larger writing current is needed and/or the sensing margin is relatively small. RRAM is relatively cheap compared to flash memory and DRAM because it is easy to miniaturize. RRAM may also have a shorter access time and/or a non-destructive read-out operation. Therefore, higher capacity RRAM may be possible, but a problem is that its set-driving voltage is relatively high.

SUMMARY

Example embodiments relate to a storage node, method of fabricating the same, semiconductor device and method of fabricating the same.

According to example embodiments, there is provided a storage node that may include a lower electrode, at least one irradiated data storage layer and an upper electrode. A semiconductor device may include a switching element and the storage node connected to the switching element. The at least one irradiated data storage layer may be irradiated by electrons. The at least one irradiated data storage layer may be formed by supplying a source material gas to a data storage layer and simultaneously irradiating electrons onto the lower electrode. The at least one irradiated data storage layer may be formed at least twice and the irradiating of the electrons may be performed for each layer. The energy of irradiated electrons may be about 1 keV or less. The at least one irradiated data storage layer may be a phase change layer. The phase change layer may be formed of a transition metal oxide layer. The at least one irradiated data storage layer may be a dielectric layer.

According to example embodiments, there is provided a method of fabricating a storage node that may include forming a lower electrode, forming at least one irradiated data storage layer on the lower electrode and forming an upper electrode on the at least one irradiated data storage layer. A method of fabricating a semiconductor device may include forming a switching element and forming the storage node connected to the switching element.

When example embodiments are used, it may be possible to lower the set voltage of the RRAM, may allow the dielectric layer of the DRAM or the ferroelectric layer of the FRAM to form more uniformly throughout the whole layer, so that electrical characteristics of the DRAM and FRAM may be improved.

BRIEF DESCRIPTION OF THE DRAWINGS

Example embodiments will be more clearly understood from the following detailed description taken in conjunction with the accompanying drawings.

FIGS. 1 to 15 are diagrams illustrating a method of fabricating a semiconductor memory device in accordance with example embodiments;

FIG. 16 is a graph illustrating an X-ray diffraction pattern of a data storage layer formed in a process of fabricating the semiconductor memory device in accordance with example embodiments;

FIG. 17 is a graph illustrating characteristics of leakage current of the data storage layer formed in a process of fabricating the semiconductor memory device in accordance with example embodiments;

FIG. 18 is a graph illustrating characteristics of capacitance of the data storage layer formed in a process of fabricating the semiconductor memory device in accordance with example embodiments;

FIG. 19 is a graph illustrating downward shift of soft breakdown voltage of the data storage layer formed in a process of fabricating the semiconductor memory device in accordance with example embodiments; and FIG. 20 to FIG. 22 are diagrams illustrating a method of fabricating a semiconductor memory device in accordance with example embodiments.

DETAILED DESCRIPTION OF EXAMPLE EMBODIMENTS

Figure 1:
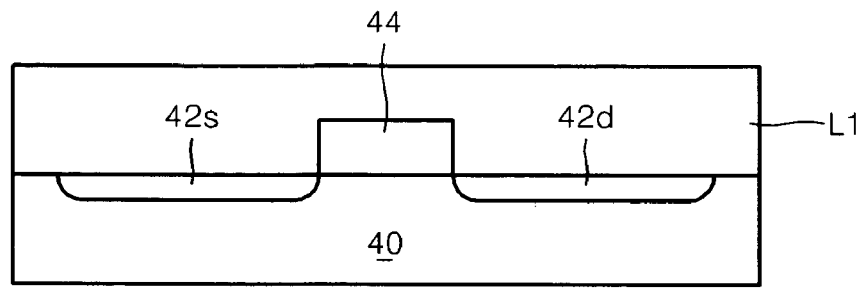
FIGS. 1-22 represent non-limiting, example embodiments as described herein.

Example embodiments will now be described more fully hereinafter with reference to the accompanying drawings, in which preferred embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. For clarification, the thickness of layers and regions illustrated in the drawings are overstated. A substrate and a transistor are not presented in figures from FIG. 4.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. The example term "below" can encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
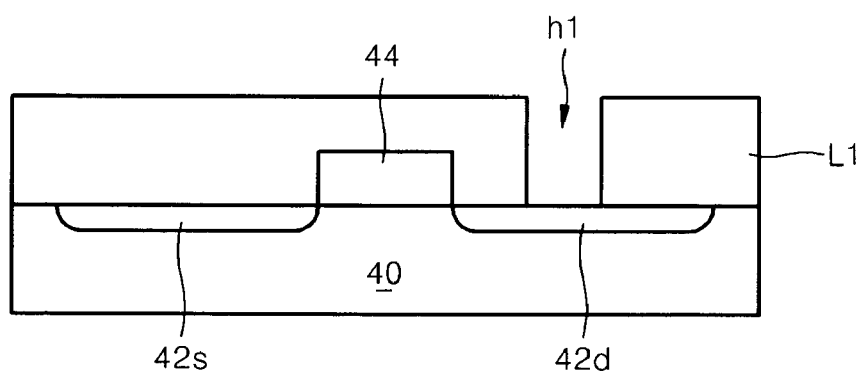
Figure 3:
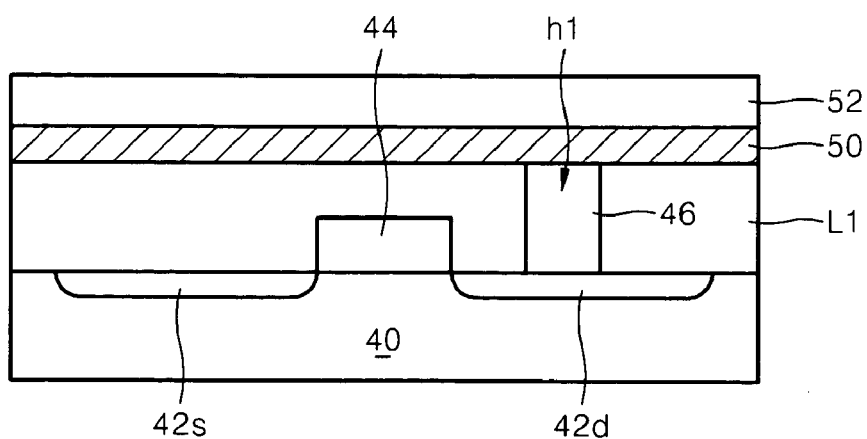

With reference to FIG. 1, a transistor may be formed of a first impurity region 42s, a second impurity region 42d and a gate stack structure 44 including a gate electrode on a substrate 40. The transistor may be used as a switching element. Instead of the transistor, another switching element, for example, a diode, may be used. The substrate 40 may be a p-type or n-type semiconductor substrate. The first and second impurity regions 42s and 42d may be formed by doping the substrate 40 with conductive impurities having a different polarity from that of the substrate 40. An interlayer insulating layer L1, covering the transistor, may be formed on the substrate 40. With reference to FIG. 2, a contact hole h1 exposing the second impurity region 42d may be formed in the interlayer insulating layer L1. The contact hole h1 may be filled with a conductive plug 46 as illustrated in FIG. 3. The conductive plug 46 may be formed of aluminium and/or doped polysilicon.

With reference to FIG. 3, a lower electrode 50 covering an upper surface of the conductive plug 46 may be formed on the interlayer insulating layer L1. The lower electrode 50 may be formed of, for example, Pt (platinum). At least one data storage layer 52 may be formed on the lower electrode 50. The at least one data storage layer 52 may have non-volatile characteristics and it may have a first state of resistance and a second state of resistance which is greater than the first resistance, based on an applied voltage. The first and second states of resistance may not change until there is a phase transition due to the voltage applied to the at least one data storage layer 52. The at least one data storage layer 52 may be formed of a transition metal oxide layer. The transition metal oxide layer may be formed of, for example, a nickel oxide (NiO) layer and/or a hafnium oxide ($HfO_2$) layer.

Figure 4:
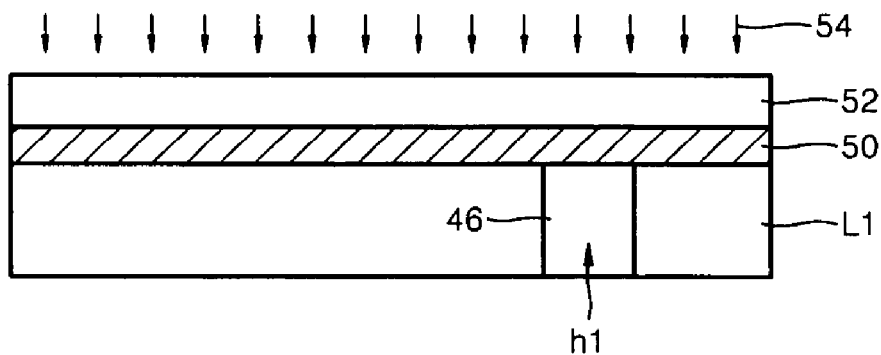

Example embodiments refer to an irradiated data storage layer. Although the at least one data storage layer may be irradiated with electrons, the at least one data storage layer may also be irradiated by another form of irradiation. With reference to FIG. 4, electrons 54 may be irradiated into the at least one data storage layer 52. The electrons 54 may be irradiated in the form of a beam onto the at least one data storage layer 52. The electron beam may be injected using an electron beam injection apparatus. The electrons may be irradiated uniformly onto the electron irradiation surface of the at least one data storage layer 52. When the electrons are irradiated into the at least one data storage layer 52 in the form of a beam, their irradiation energy may vary based on the material used to form the at least one data storage layer 52. The irradiation energy may be about 1 KeV or less. When the at least one data storage layer 52 is a nickel oxide layer, the irradiation energy of the electrons may be in a range of about 20 eV-about 100 eV.

As electrons are irradiated onto the at least one data storage layer 52, the state of the bond between the materials forming the at least one data storage layer 52 may be weakened. For example, the bond between NiO and NiO and/or $HfO_2$ and $HfO_2$, which form the at least one data storage layer 52, may weaken. When the at least one data storage layer 52 is in the weakened state, the at least one data storage layer 52 may be in a soft breakdown state. When the at least one data storage layer 52 is in the soft breakdown state, the voltage applied to form a current path in the at least one data storage layer 52 may be defined as the first voltage. Before the at least one data storage layer 52 is in the soft breakdown state, the voltage applied to form the current path in the at least one data storage layer 52 may be defined as the second voltage. The first voltage may be lower than the second voltage.

Figure 5:
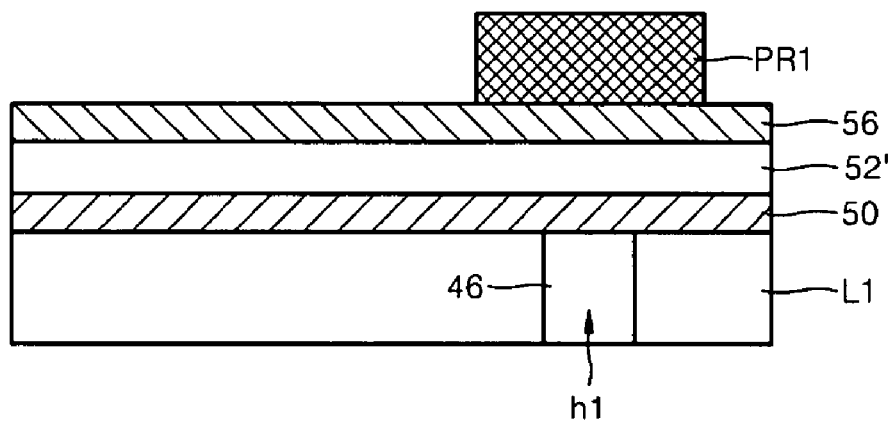
Figure 6:
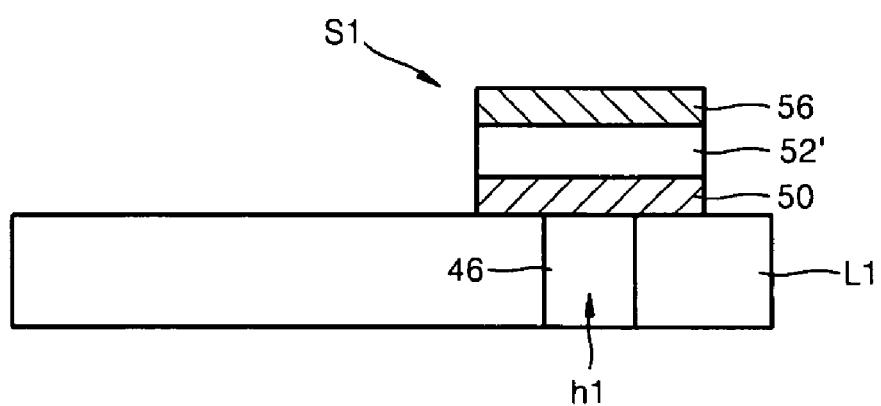

With reference to FIG. 5, after the electron irradiation of the at least one data storage layer 52 is completed to form at least one irradiated data storage layer 52', an upper electrode 56 may be formed on the at least one irradiated data storage layer 52'. The upper electrode 56 may be formed of the same materials as the lower electrode 50. A photoresist layer pattern PR1 may be formed on the upper electrode 56. The photoresist layer pattern PR1 may be formed to cover the conductive plug 46. The photoresist layer pattern PR1 may be used as an etch mask to etch the exposed portion of the upper electrode 56. Etching may be performed until the interlayer insulating layer L1 is exposed by changing the etching condition according to what is being etched. After etching, the photoresist layer pattern PR1 may be removed. As a result of etching, a storage node S1, including the lower electrode 50, at least one irradiated data storage layer 52' and upper electrode 56, may be formed on the interlayer insulating layer L1. The storage node S1 may cover the conductive plug 46.

Figure 7:
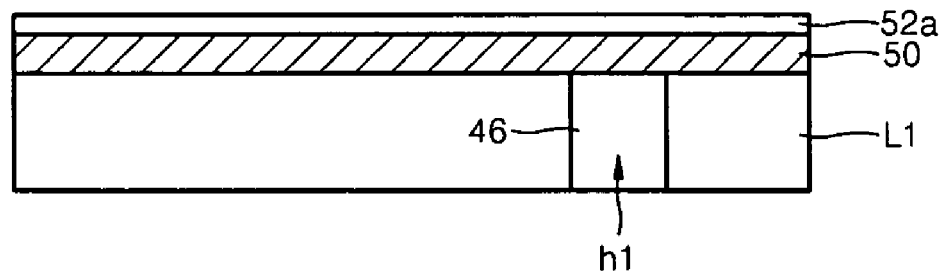
Figure 8:
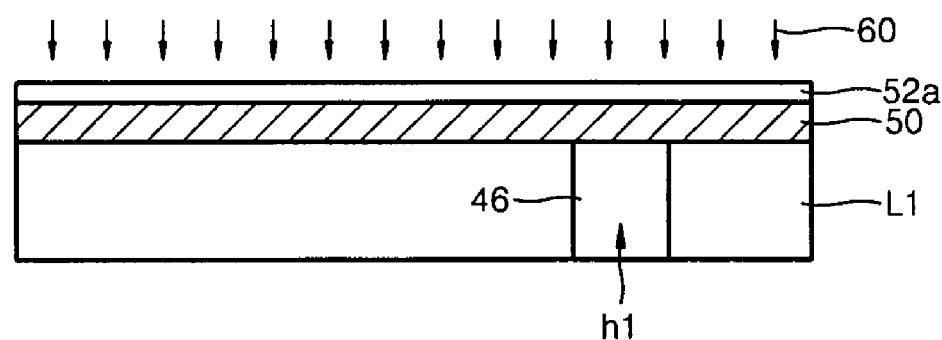

With reference to FIG. 7, a first material layer 52a used as the data storage layer may be formed on the lower electrode 50. The first material layer 52a may be formed of the same materials as the at least one data storage layer 52. The first material layer 52a may be formed more thinly than the at least one data storage layer 52. With reference to FIG. 8, after the first material layer 52a is formed, electron irradiation 60 (hereinafter, referred to as primary electron irradiation) may be performed on the first material layer 52a to form first irradiated material layer 52a'. The primary electron irradiation 60 may be performed by the same method as the electron irradiation 54 described above. The irradiation energy in the primary electron irradiation 60 may be lower than that of electron irradiation 54.

Figure 9:
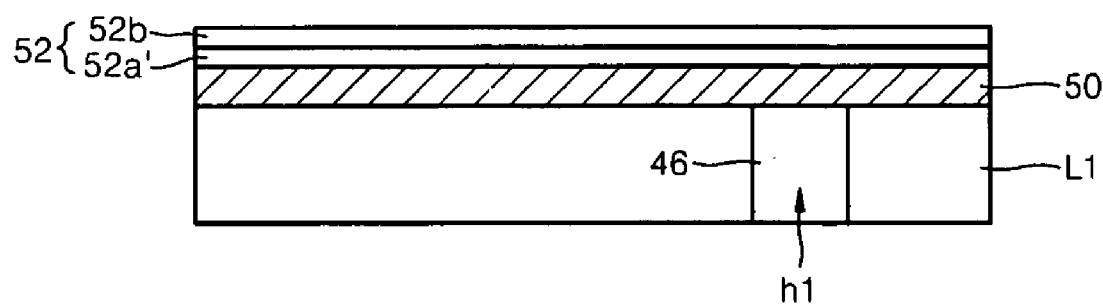
Figure 10:
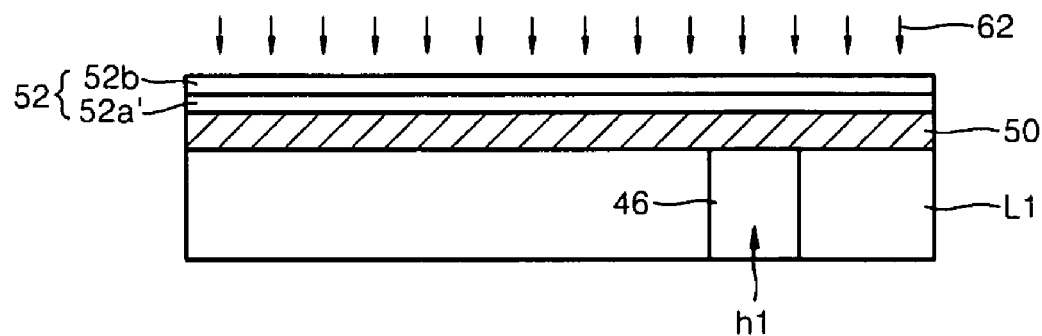

With reference to FIG. 9, a second material layer 52b may be formed on the first irradiated material layer 52a' after the primary electron irradiation 60. The second material layer 52b may also be used as a data storage layer and may be formed of the same materials as the first material layer 52a. After the second material layer 52b is formed, electron irradiation 62 (hereinafter, referred to as secondary electron irradiation) may be performed on the second material layer 52b to form the second irradiated material layer 52b', as illustrated in FIG. 10. The secondary electron irradiation 62 may differ according to the thickness of the second material layer 52b but may be performed under the same conditions as the primary electron irradiation 60. The at least one irradiated data storage layer 52', formed of the first and second irradiated material layers 52a' and 52b', may be formed.

Figure 11:
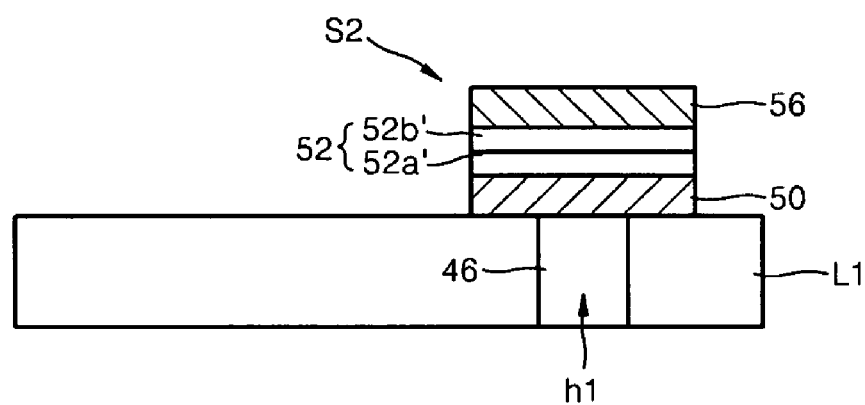

After the secondary electron irradiation 62 is performed, the upper electrode 56 may be formed on the second irradiated material layer 52b'. The photoresist layer pattern may be formed on the upper electrode 56. The upper electrode 56, the first and second irradiated material layers 52a' and 52b' and the lower electrode 50 may be sequentially etched using the photoresist layer pattern as the etch mask in the same etching process as described above. As a result of etching, a storage node S2 including the lower electrode 50, the first and second irradiated material layers 52a' and 52b' and the upper electrode 56, may be formed on the interlayer insulating layer L1 as illustrated in FIG. 11. The storage node S2 may be formed in the same position as the storage node S1.

Figure 12:
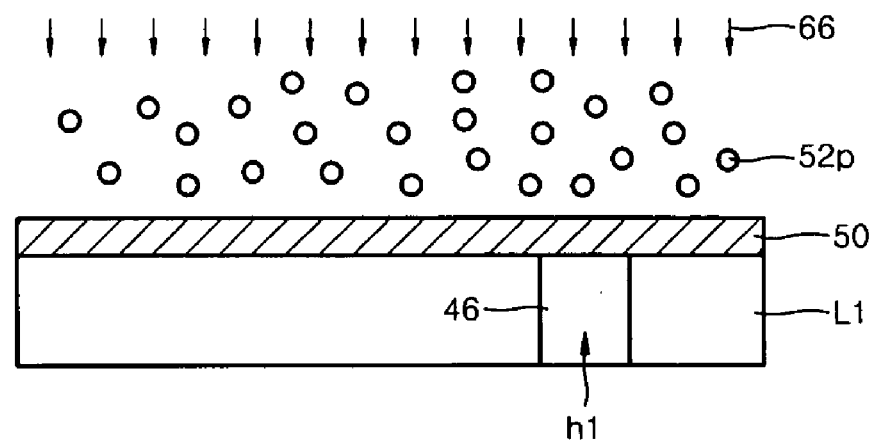
Figure 13:
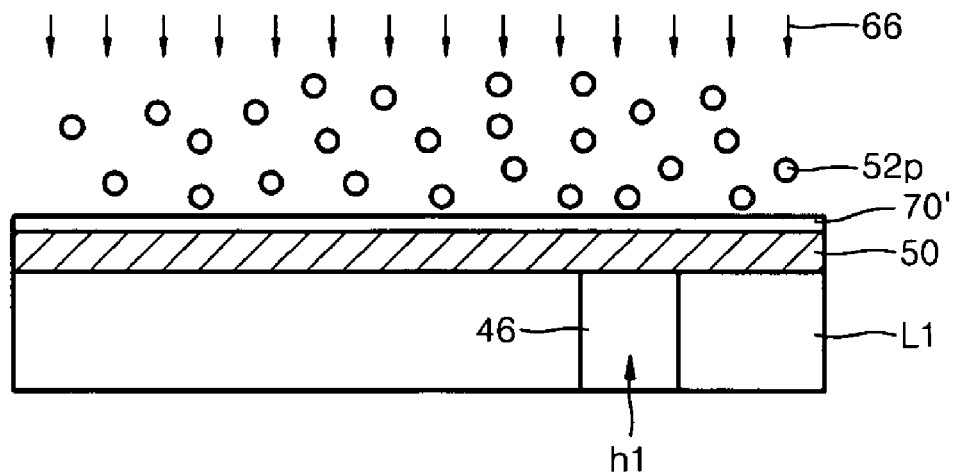
Figure 14:
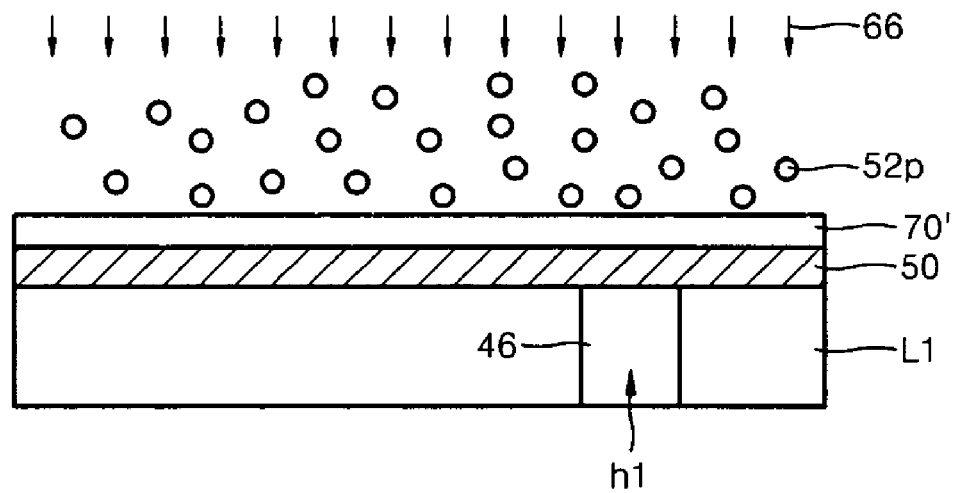
Figure 15:
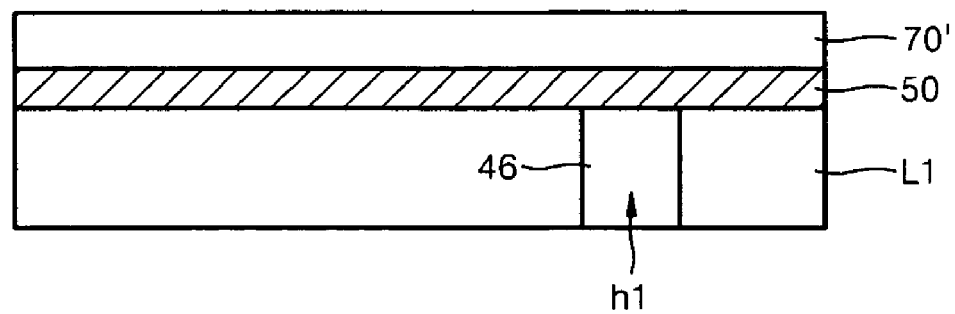

With respect to FIGS. 12 to 14, the lower electrode 50 may be formed on the interlayer insulating layer L1. Source material gas 52p, used in forming the data storage layer 50, may be supplied onto the lower electrode 50 using, for example, sputtering equipment. Electron irradiation 66 on the lower electrode 50 may be performed simultaneously. As a result, at least one irradiated data storage layer 70' may be formed on the lower electrode 50 as illustrated in FIG. 15. The electron irradiation 66 may be performed in the same manner as electron irradiation 54. When the at least one irradiated data storage layer 70' is an oxide, the atmosphere in the formation process of the at least one irradiated data storage layer 70' may be oxygen. The at least one irradiated data storage layer 70' may include two layers, formed as described above. After the at least one irradiated data storage layer 70' is formed, a storage node may be formed by forming the upper electrode (not shown) on the at least one irradiated data storage layer 70' and the lower electrode 50, the at least one irradiated data storage layer 70' and upper electrode may be patterned as described above.

Figure 16:
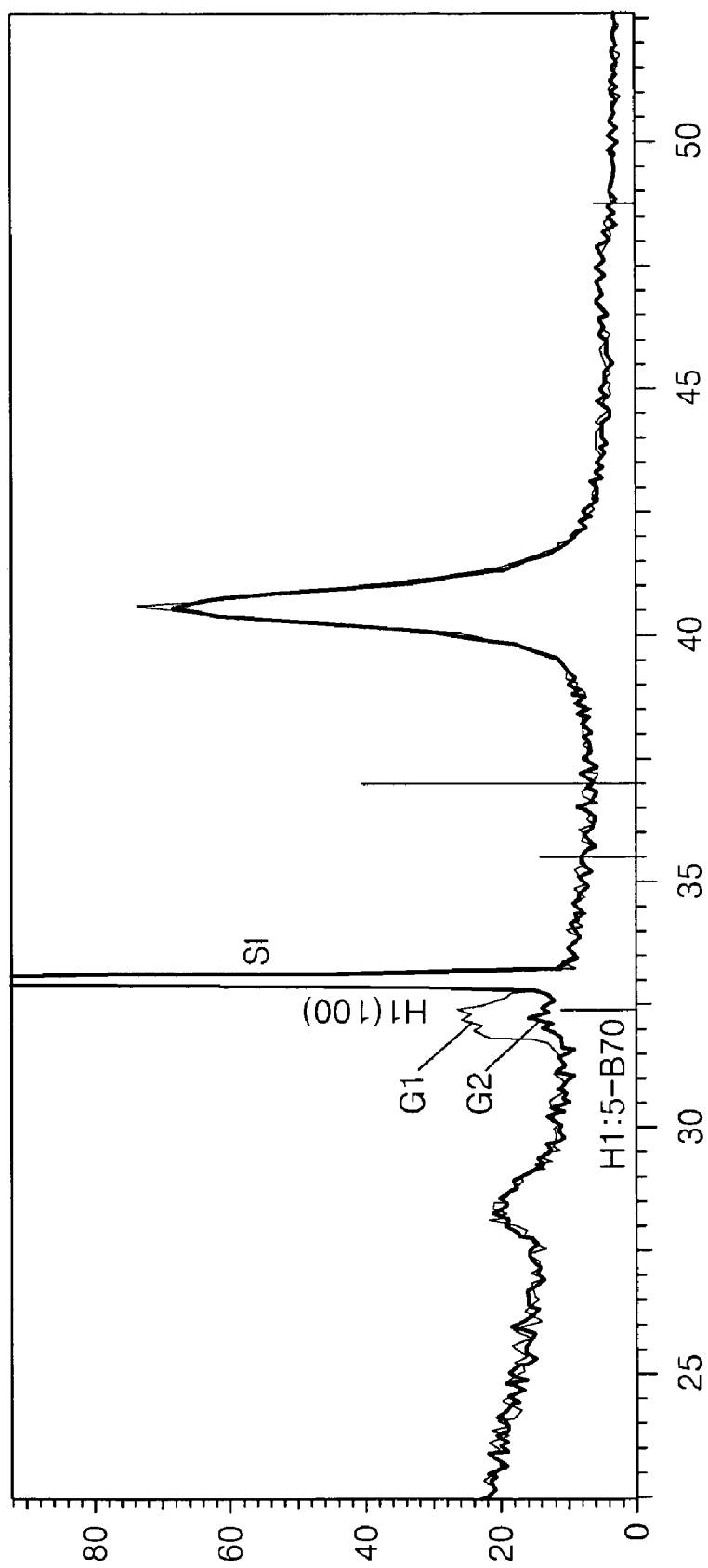

FIG. 16 is a graph illustrating an X-ray diffraction pattern with respect to the data storage layer. In FIG. 16, line G1 represents an X-ray diffraction pattern of the data storage layer when electron irradiation is not performed in forming the data storage layer. Line G2 represents an X-ray diffraction pattern of the data storage layer when electron irradiation is performed in forming the data storage layer. Comparing lines G1 and G2, the peaks of lines G1 and G2 may be different within the diffraction angle range of about 32° and about 33°.

In the diffraction angle range, the peak of line G1 may be higher than the peak of line G2. The peak of line G1 as shown in the diffraction angle range is caused by Hf (hafnium) which is not oxidized and exists in the direction (100) of the data storage layer $HfO_2$ where the electrons are not irradiated. Reduction of the peak of line G2 as shown in the diffraction angle range is caused by $HfO_2$ where Hf is oxidized and exists in the direction (100) of the data storage layer $HfO_2$ where the electrons are irradiated.

From lines G1 and G2, material formation of the data storage layer may be more uniform when the electron irradiation is performed than when the electron irradiation is not performed in the process of forming the data storage layer. For example, when the data storage layer is the $HfO_2$ layer, if the electron irradiation is not performed in forming the data storage layer, un-oxidized hafnium may exist in the data storage layer. The data storage layer may be finally formed of $HfO_2$ and Hf. On the other hand, if the electron irradiation is performed in forming the data storage layer, the composition of the data storage layer may be finally formed of almost $HfO_2$.

Figure 17:
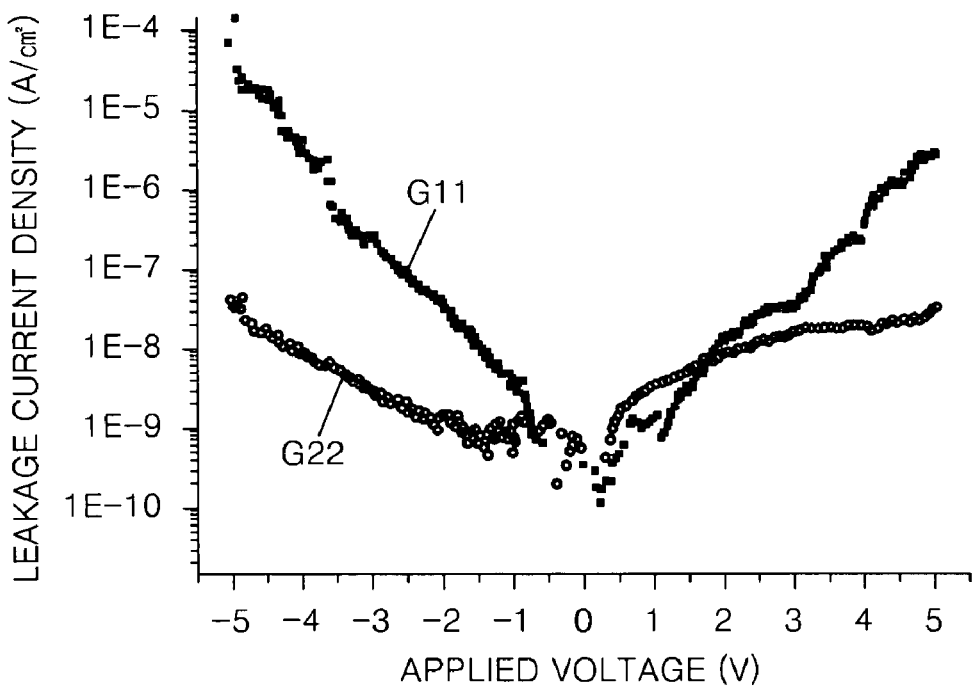

FIG. 17 illustrates a change in leakage current density for the data storage layer where the electrons are irradiated and the data storage layer where the electrons are not irradiated. In FIG. 17, line G11 is where the electrons are not irradiated on the data storage layer and line G22 is where the electrons are irradiated on the data storage layer. Comparing lines G11 and G22, there may be a reduced leakage current in the data storage layer where the electrons are irradiated.

Figure 18:
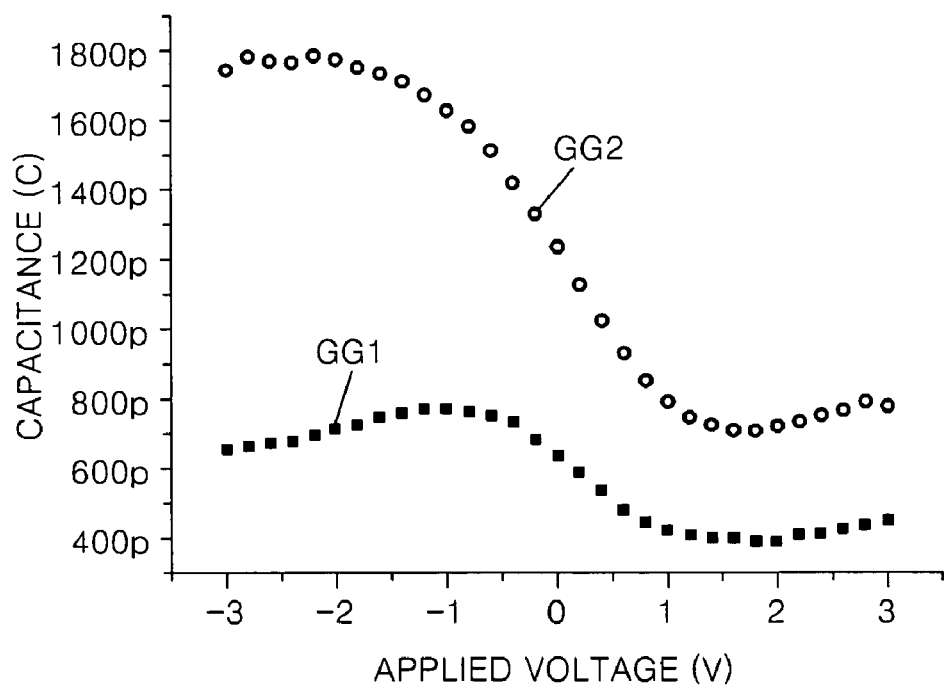

FIG. 18 illustrates a change in capacitance of the data storage layer where the electrons are irradiated and the data storage layer where the electrons are not irradiated. In FIG. 18, line GG1 represents the data storage layer where the electrons are not irradiated and line GG2 represents the data storage layer where the electrons are irradiated. In comparing lines GG1 and GG2, the capacitance may be greater in the data storage layer where the electrons are irradiated than where the electrons are not irradiated.

Figure 19:
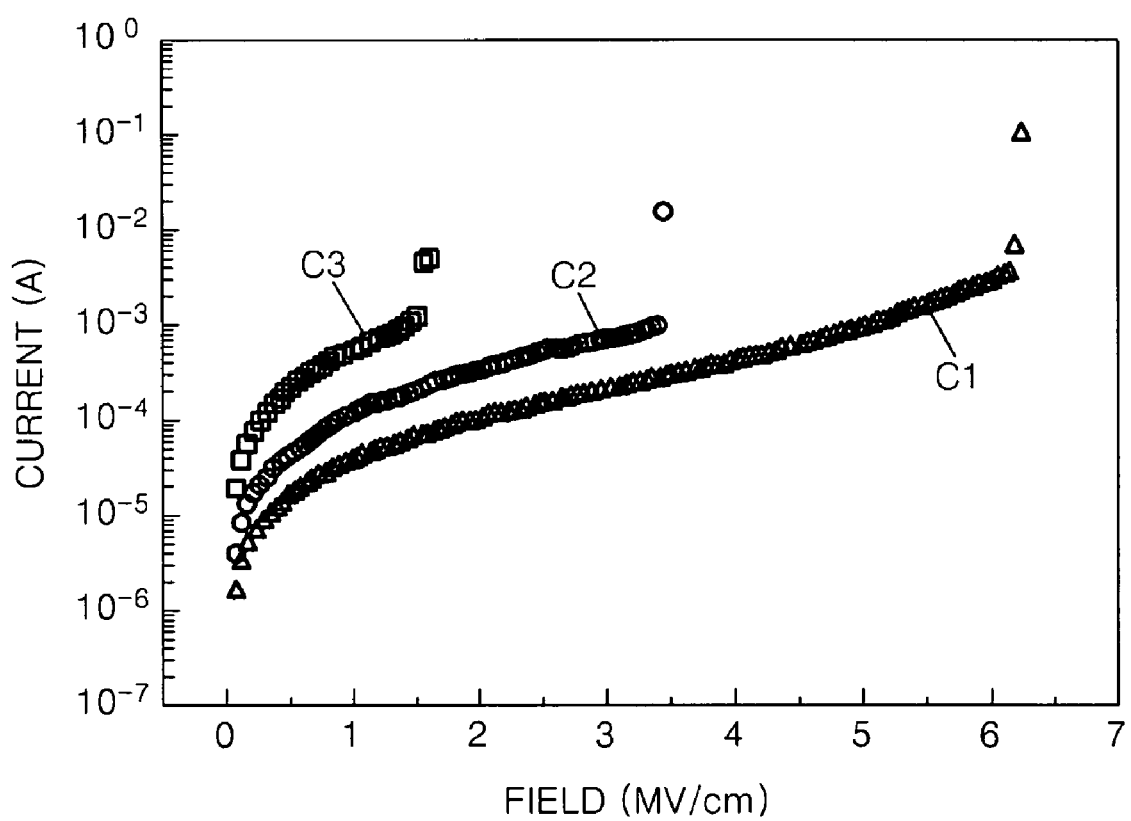

FIG. 19 illustrates a change in the set voltage of the data storage layer where the electrons are irradiated and where the electrons are not irradiated. For FIG. 19, the NiO layer may be used as the data storage layer. In FIG. 19, line C1 and line C2 represent changes in set voltage of the data storage layer where the electrons are not irradiated and line C3 represents a change in set voltage of the data storage layer where the electrons are irradiated. Comparing lines C1 and C2 and line C3, the set voltage of the data storage layer where the electrons are irradiated may be less than that of the data storage layer where the electrons are not irradiated.

In example embodiments, the above-described characteristics according to the electron irradiation are applied to improve characteristics of memory devices other than RRAM (e.g., DRAM and/or FRAM).

Figure 20:
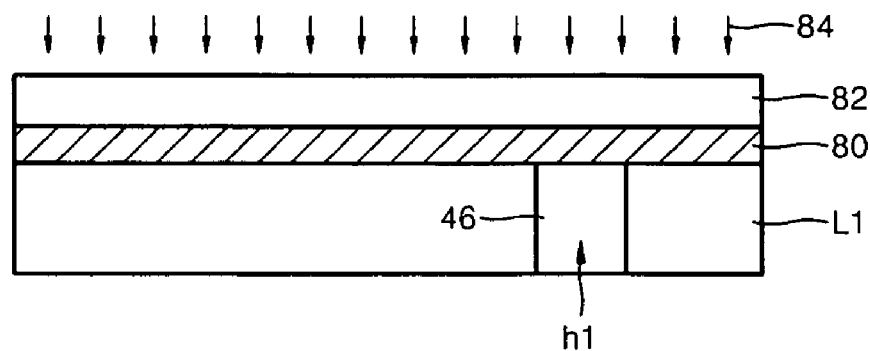

With reference to FIG. 20, a lower electrode 80 covering the exposed whole surface of a conductive plug 46 may be formed on an interlayer insulating layer L1. The lower electrode 80 may be the lower electrode of a DRAM capacitor or the lower electrode of an FRAM capacitor. At least one dielectric layer 82 may be formed on the lower electrode 80. The at least one dielectric layer 82 may be an insulating layer having an average dielectric constant, for example, an $SiO_2$ layer. The at least one dielectric layer 82 may also be an insulating layer having a relatively high dielectric constant, for example, nitride layer, PZT layer, PTO layer, SBT layer, BST layer, PLZT layer, STO layer, BTO layer, TNO layer, TWO layer, and/or any other suitable layer. After the at least one dielectric layer 82 is vapor-deposited on the lower electrode 80, electron irradiation 84 may be performed on the at least one dielectric layer 82. The electron irradiation 84 may be performed in the same manner as electron irradiation 54.

Figure 21:
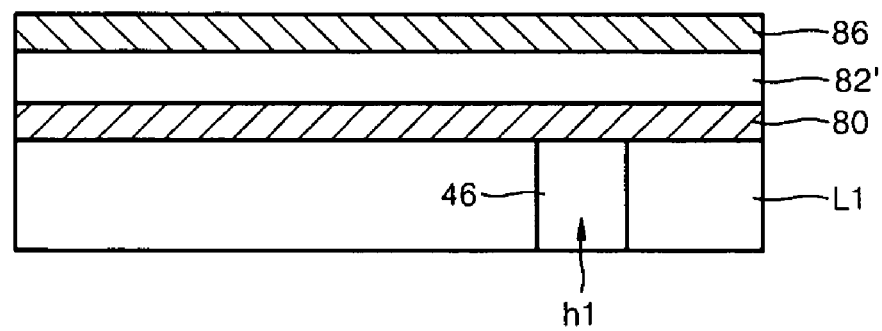
Figure 22:
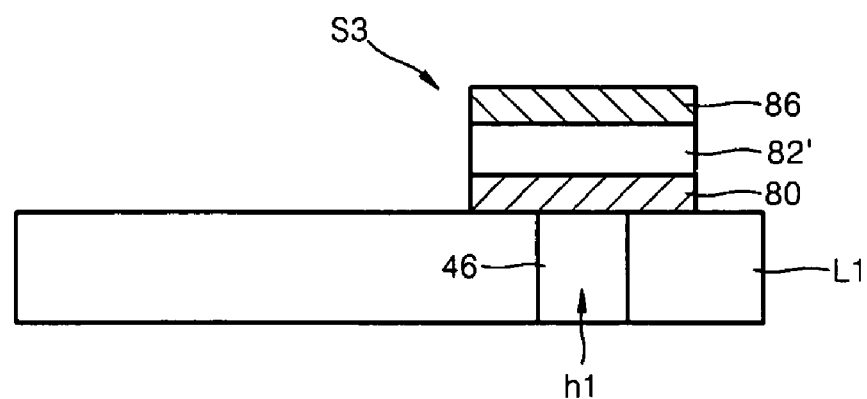

With reference to FIG. 21, after the electron irradiation 84, an upper electrode 86 may be formed on the at least one dielectric layer 82. The upper electrode 86 may be formed of the same materials as the lower electrode 80 but it may also be formed of other materials, different from the lower electrode 80. FIG. 22 illustrates a storage node S3 formed by patterning the lower electrode 80, the at least one dielectric layer 82 and the upper electrode 86 in the same manner as described above. The storage node S3 may be a DRAM capacitor and/or a FRAM capacitor.

As described above, example embodiments may perform the electron irradiation on at least one data storage layer after or in the process of forming the at least one data storage layer of the storage node in the process of fabricating a semiconductor memory device. As a result of the electron irradiation, the at least one data storage layer may be in soft breakdown, and thus, the set voltage of the RRAM may become relatively low when compared with electron irradiation not being performed. When the electron irradiation is applied to the process of fabricating a DRAM or FRAM, the composition of the at least one dielectric layer of the DRAM or the composition of the ferroelectric layer of the FRAM may be uniformly formed throughout the whole layer, thereby improving electrical characteristics of the DRAM and FRAM.

While example embodiments have been particularly shown and described with reference to example embodiments thereof, it will be understood by those of ordinary skill in the art that various changes in form and details may be made therein without departing from the spirit and scope of the following claims. For example, the skilled person may apply the electron irradiation process to processes of fabricating other semiconductor memory devices as well as a process of fabricating RRAM, DRAM, PRAM and/or FRAM to irradiate data storage layers, phase change layers, dielectric layers, ferroelectric layers and/or resistance conversion layers. Also, the electron irradiation mode may be varied. It may be possible to partially irradiate electrons. Therefore, the scope shall be defined by the technical idea as described in the claims and not by the example embodiments.

What is claimed is:

1. A method of fabricating a storage node, the method comprising:
    forming a lower electrode;
    forming at least one irradiated data storage layer on the lower electrode; and
    forming an upper electrode on the at least one irradiated data storage layer,
    wherein the at least one irradiated data storage layer is made of nickel oxide (NiO), hafnium oxide ($HfO_2$) or a combination thereof, and
    wherein forming the at least one irradiated data storage layer includes irradiating the at least one data storage layer with electrons until the irradiated data storage layer is in a soft breakdown state.

2. A method of fabricating a semiconductor device, the method comprising:
    forming a switching element; and
    forming the storage node according to claim 1, connected to the switching element.

3. The method of claim 1, wherein forming the at least one irradiated data storage layer includes supplying a source material gas to the lower electrode and simultaneously irradiating the electrons onto the lower electrode.

4. The method of claim 1, wherein forming the at least one irradiated data storage layer includes forming two irradiated data storage layers.

5. The method of claim 1, wherein an energy of the irradiated electrons is about 1 keV or less.

* * * * *